United States Patent [19]

Sigler

[11] Patent Number: 5,065,092
[45] Date of Patent: Nov. 12, 1991

[54] SYSTEM FOR LOCATING PROBE TIPS ON AN INTEGRATED CIRCUIT PROBE CARD AND METHOD THEREFOR

[75] Inventor: Michael R. Sigler, Colorado Springs, Colo.

[73] Assignee: Triple S Engineering, Inc., Colorado Springs, Colo.

[21] Appl. No.: 524,139

[22] Filed: May 14, 1990

[51] Int. Cl.$^5$ .......................... G01R 1/00; G01R 1/067
[52] U.S. Cl. .............................. 324/158 F; 324/158 P; 33/1 M
[58] Field of Search ...................... 324/158 P,F, 72.5; 33/1 M, 503

[56] References Cited

U.S. PATENT DOCUMENTS

| | | | |
|---|---|---|---|
| 4,342,957 | 8/1982 | Russell | 324/73 R |
| 4,342,958 | 8/1982 | Russell | 324/73 R |
| 4,719,703 | 1/1988 | Ross et al. | 33/1 M |
| 4,751,457 | 6/1988 | Veenendaphl | 324/158 F |
| 4,782,598 | 11/1988 | Guarini | 33/503 |
| 4,876,515 | 10/1989 | Ball | 324/538 |
| 4,918,374 | 4/1990 | Stewart et al. | 324/158 R |
| 4,931,962 | 6/1990 | Palleiko | 73/105 |

OTHER PUBLICATIONS

Probe Technology, Probilt 500 brochure, Wentworth Laboratories, Inc., Compass Model CMP-200 brochure.
Triple S Engineering, The Pacer Automatic Integrated Probe Analysis, Maintenance and Repair Station brochure.
Smith, Automating Probe Card Analysis and Maintenance, Microelectronic Manufacturing and Testing, Mar. 1990, pp. 33-34.

*Primary Examiner*—Kenneth A. Wider
*Assistant Examiner*—William J. Burns
*Attorney, Agent, or Firm*—Dorr, Carson, Sloan & Peterson

[57] ABSTRACT

A system for determining probe tip alignment for a probe card having a plurality of probes downwardly extending in a defined region of the probe card. Each probe has a tip assigned to a precise X, Y position in a plane spaced from the probe card. The assigned X, Y position is dictated by the topology of the integrated circuit chip for which the probe card was designed. A first memory stores the assigned X, Y position for each of the tips, a second memory stores the measured location of the plane that each of the tips is found in, and a sensor measures the actual X, Y position of an individual probe tip. The sensor is moved to the measured plane at the assigned X, Y position for each tip and obtaining, for each tip, a meausred X, Y position. A computer then displays in a monitor by means of suitable icons, all probes which have a measured X, Y position within an acceptable window of the assigned X, Y position and then displays, with suitable icons, all probe tips having a measured X, Y position exceeding the window of acceptability.

18 Claims, 6 Drawing Sheets

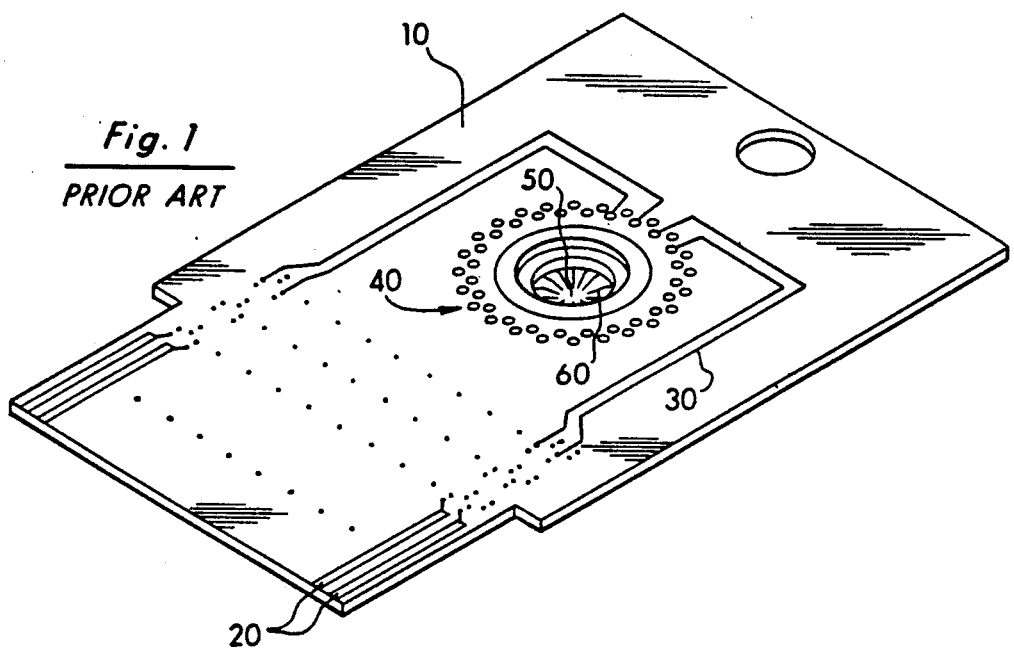
Fig. 1
PRIOR ART
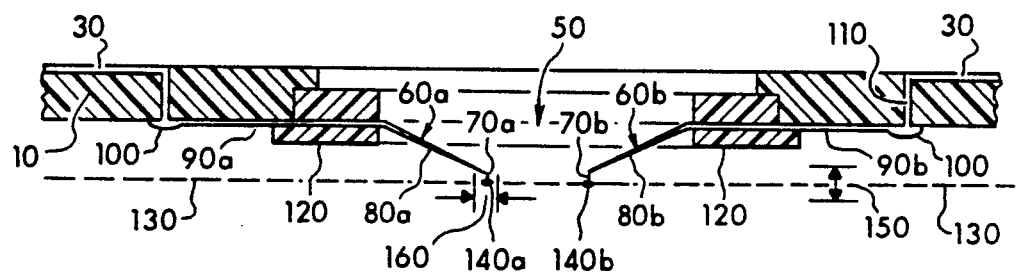
Fig. 2
PRIOR ART
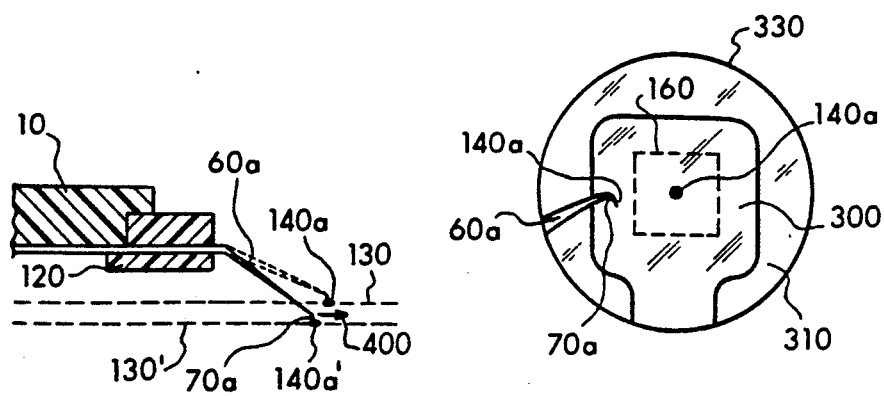
Fig. 4
PRIOR ART
Fig. 3
PRIOR ART

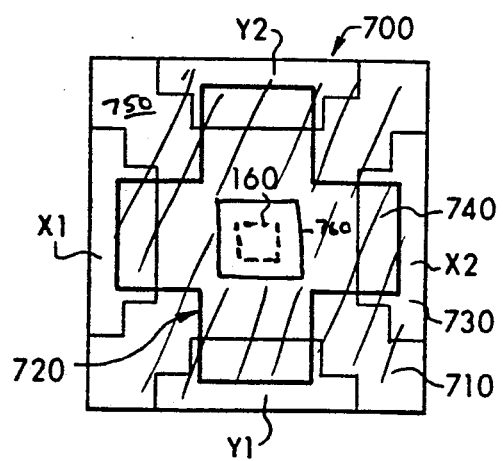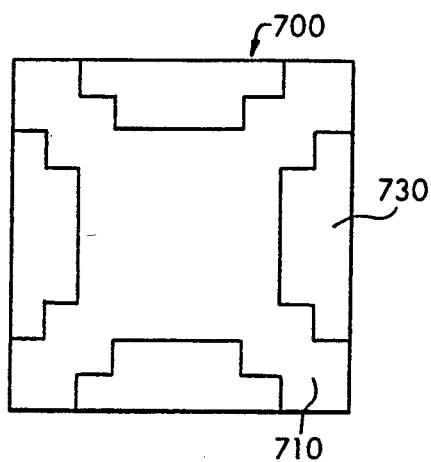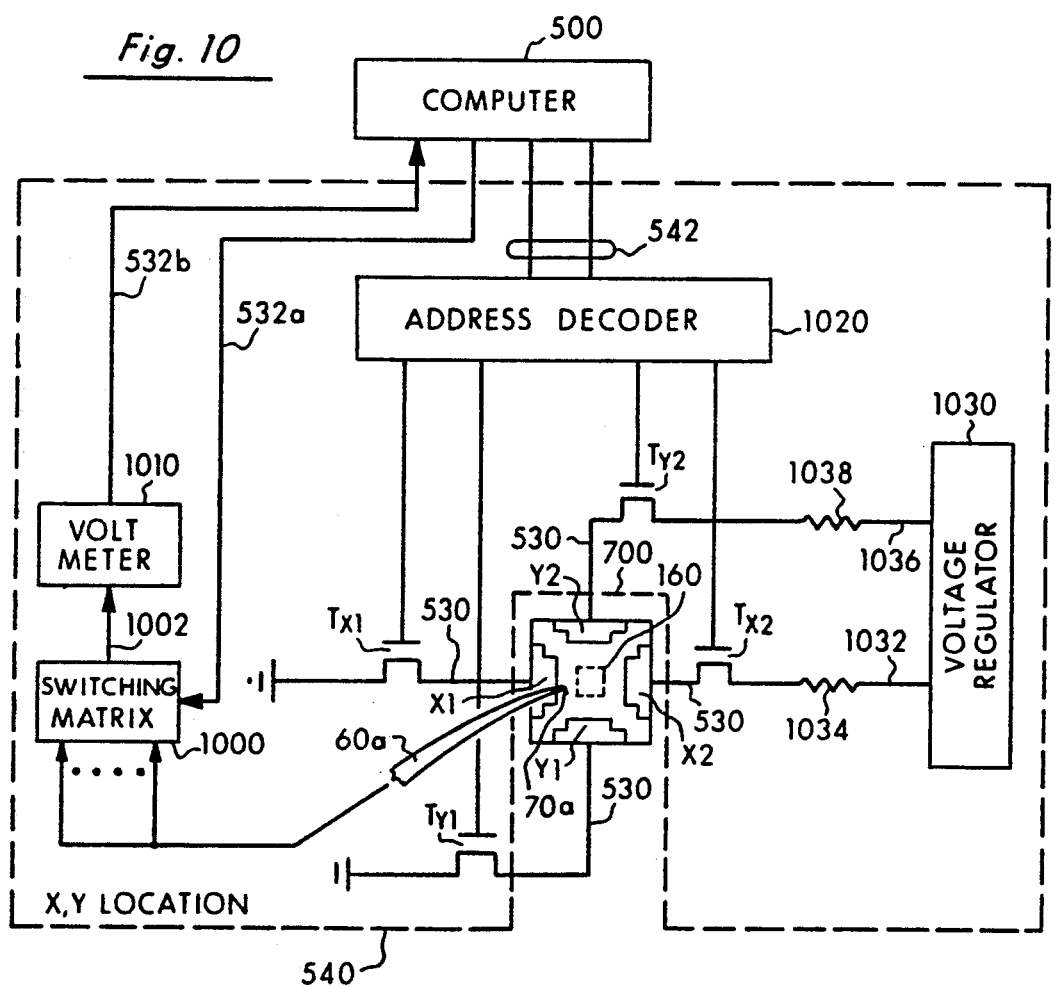

SYSTEM FOR LOCATING PROBE TIPS ON AN INTEGRATED CIRCUIT PROBE CARD AND METHOD THEREFOR

BACKGROUND OF THE INVENTION

1. Field of the Invention

The present invention relates to probe cards for testing semiconductor chips and, more particularly, to an automated system and method for locating the tips of probes on a probe card so that if any of the probe tips are out of proper alignment, they can be adjusted back into proper alignment.

2. Discussion of Prior Art

In FIG. 1, a conventional probe card 10 is shown being rectangular in shape A variety of conventional shapes exist for a probe card. Probe card 10 illustrates a certain number of probes and any number of probes may be provided such as 100 through 500 probes per card. The shape of a probe card, the number of probes utilized, and the geometric placement of the probes is entirely dependent upon the topological structure of the semiconductor chip for which the probe card is designed. The probe card 10 of FIG. 1 is merely set forth as one conventional example.

Probe card 10 is essentially a printed circuit card having a number of pin connections 20 interconnected over printed circuit paths 30 to a desired geometric configuration of probes 40 located around a defined region 50. This defined region 50 having the probes 60 downwardly extending therein is better shown in FIG. 2.

In FIG. 2, each probe 60 has a tip 70, an angled body portion 80, and a horizontal portion 90. The horizontal portion 90 is soldered 100 to a pass through conductive path 110 connected to the printed circuit path 30. Other conventional probe cards are soldered on the top of the card. A support ring 120 is utilized to firmly engage the horizontal portion 90 of each probe around the defined region 50. Each probe 60 is carefully oriented to downwardly extend into the defined region 50 so that each tip 70 is placed in the same plane 130 at an assigned position or point 140 in plane 130. Hence, when the probes 60, as contained in the card 10, are lowered onto a semiconductor chip which would occupy plane 130, the probe tips 70 engage pads on the chip at precise and desired locations. Of course, the location of the plane 130 can exist within a desired range 140 and each tip 70 can exist within a given range 160 of its assigned position 140 on the plane.

After significant use of the probe card 10 in testing semiconductor chips, and as discussed above, a probe tip 70 may move out of its assigned position 140 and plane 130. This is graphically illustrated in FIGS. 3 and 4 wherein the pin 60a has been bent downwardly to occupy a new plane 130' and a new position in the plane 140a'.

Under the teachings of the prior art approach, and as shown in FIG. 3, an operator would view the tip 70a through a microscope 330 as it engages the pad 300 of a silicon chip 310. The operator would view the location of each probe tip to the underlying pad on the silicon chip and this process could take considerable time. In addition, the operator would subjectively imagine a centering window 160 on the pad 300 and if the probe tip 70a fell outside the window 160, then the operator would use a tweezers to manually move the tip 70a of probe 60a in the direction of arrow 400 as shown in FIG. 4. It would be the goal of the operator to continue this process until the probe tip 70a occupies a desired position 140 within the window 160 of the pad 300. It is to be understood that the probe tip may be in any unaligned position such as for example above plane 130.

The article "Automating Probe Card Analysis and Maintenance" by Ralph W. Smith and Jesse Hendrickson, discusses the use of probe cards to test semiconductor chips and systems to maintain and repair such probe cards. Commercially, systems are available for the automatic analysis, maintenance and repair of probe cards such as the PACER from Triple S Engineering, Inc., 1042 Elkton Drive, Colorado Springs, Colo. 80907, the COMPASS from Wentworth Laboratories, Inc., 500 Federal Road, Brookfield, CT 06804, and the PROBILT 500 from Probe Technology, 3000 Olcott Street, Santa Clara, Calif. 95054.

3. Statement of the Problem

A need exists for a fully automatic system for accurately locating the tips of probes on a probe card and to minimize or eliminate operator subjectivity in determining probe alignment.

A search of prior patents directed to the above-identified need was conducted which resulted in the following patents:

| Russell | 4,342,958 | August 3, 1982 |
| Russell | 4,342,957 | August 3, 1982 |
| Stewart, et al | 4,918,374 | April 17, 1990 |

Of the patents uncovered, only U.S. Pat. No. 4,918,374 is pertinent to the teachings of the present invention. This patent sets forth a method and apparatus for inspecting integrated circuit probe cards. In the '374 patent, the tips of probes in probe card are scanned across a check plate having a conductivity transition border. This results in the generation of two conductivity values in the X direction and two conductivity values in the Y direction. A pair of conductivity values are generated in each direction when a probe tip first "makes" contact with the conductivity transition border and when it "breaks" conductivity with the conductivity transition border. All probe tips are scanned across the conductivity transition borders at the same time. The '374 provides an approximation as to the actual probe tip location.

A need exists to individually sense the precise position of each probe tip and to display, via a computer monitor, the actual location of each individual probe tip. Hence, a need exists for a fully automatic system for individually and precisely locating the tips of each probe on a probe card and for displaying the results visually for an operator to manually adjust the probe tip into alignment.

4. Solution to the Problem

The present invention provides a solution to the above problem by providing a system and method for individually measuring the actual X, Y position of each probe tip in a probe card and comparing it to an assigned X, Y position thereby eliminating operator subjectivity in making such determinations. The system and method automatically measures each probe tip and displays the results in a computer monitor for an operator to quickly view which probe tips are out of alignment. The operator can cause the system and method of the present invention to display the precise location, as measured by the present invention, of a tip with respect to its assigned X, Y position so that the operator can know in which direction and how much the probe tip should be adjusted. The system then checks to verify that a proper alignment by the operator has been made. If not, the operator is instructed to realign the probe tip.

SUMMARY OF INVENTION

The present invention pertains to a unique system for determining probe tip alignment for a probe card having a plurality of probes downwardly extending in a defined region of the probe card. Each probe has a tip assigned to a precise X, Y position in a plane spaced from the probe card. The assigned X, Y position is dictated by the topology of the integrated circuit chip for which the probe card was designed. The system of the present invention includes memory for storing the assigned X, Y position for each of the tips, a second memory for storing the measured and discrete location of the plane that each of the tips is found in, a sensor for measuring the X, Y position of an individual probe tip and a means for moving the sensor in the X, Y, and Z directions. The system of the present invention uses a computer to move the sensor to the measured plane at the assigned X, Y position for each tip and obtaining, for each tip, a measured X, Y position. The computer then displays in a monitor by means of suitable icons, all probes which have a measured X, Y position within an acceptable window of the assigned X, Y position and for displaying, with a suitable icon, all probe tips having a measured X, Y position exceeding the window of acceptability. The operator of the system can then select those probe tips which need alignment and for each probe tip selected, the computer generates a screen in the monitor showing the measured X, Y position in relation to the assigned X, Y position and the window of acceptability. The operator can quickly adjust the unaligned probe tip into alignment since the monitor provides an indication as to direction and amount the probe tip must be adjusted

DESCRIPTION OF THE DRAWING

FIG. 1 sets forth a perspective illustration of a conventional PRIOR ART probe card;

FIG. 2 is a cross-section through the defined region of the PRIOR ART probe card wherein the tips of the probes downwardly extend;

FIG. 3 is an illustration of the PRIOR ART microscopic view of the manual determination of whether a probe tip is properly aligned;

FIG. 4 is a cross-section showing the PRIOR ART approach of physically realigning a probe tip;

FIG. 7 is a top planar view of the sensor of the present invention;

FIG. 8 is a bottom planar view of the sensor of the present invention;

FIG. 10 is a block diagram schematic of the electronics of the present invention.

1. GENERAL COMPONENTS OF THE SYSTEM

Figure 5:
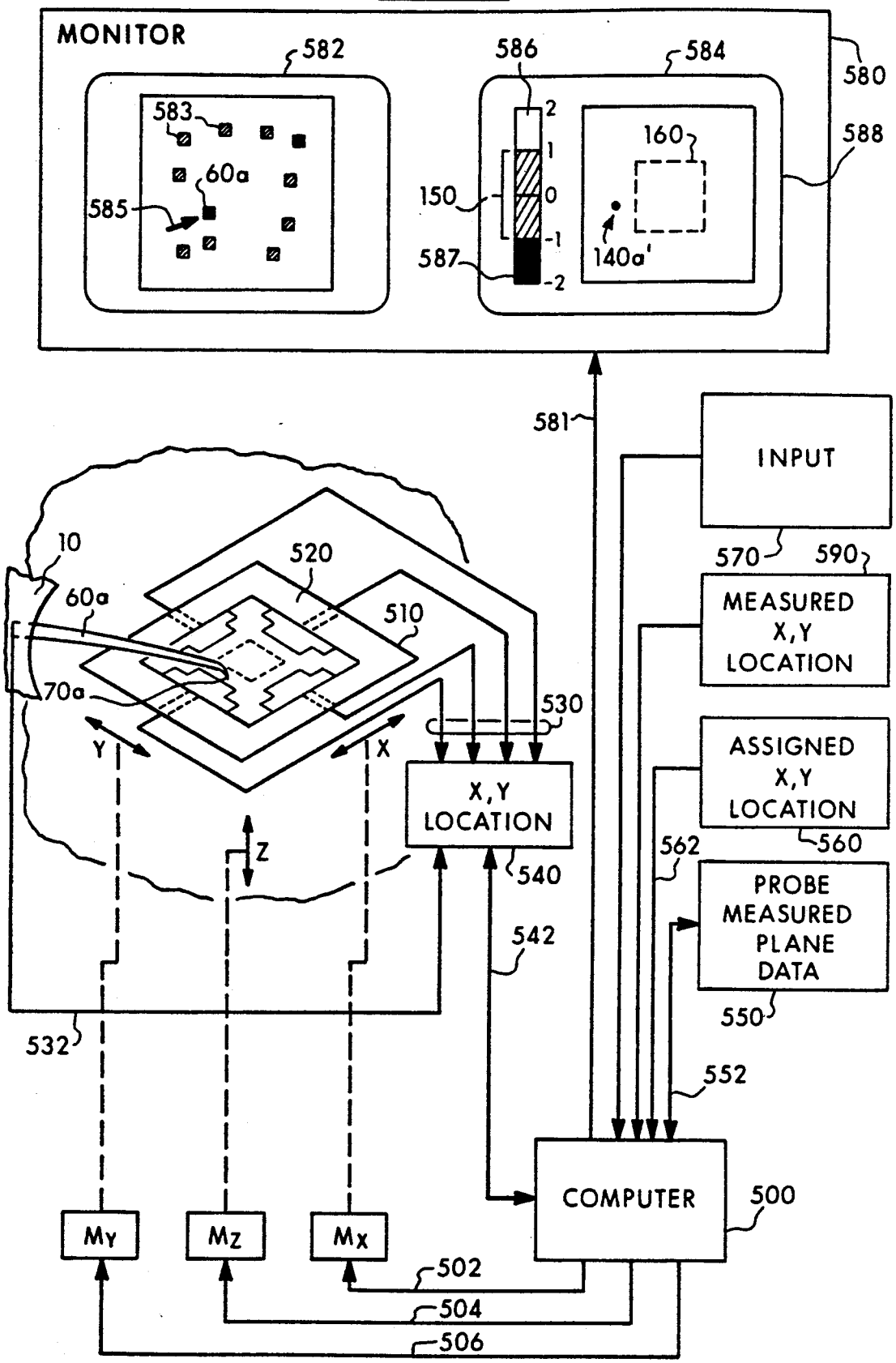
FIG. 5 is a block diagram representation of the components of the present invention.

In FIG. 5, the overall block diagram system components of the present invention are set forth. The present invention modifies and improves upon the automatic innovative probe card analysis, maintenance and repair station sold under the trademark THE PACER, by Triple S Engineering, Inc., 142 Elkton Drive, Colorado Springs, Colo. 80907. THE PACER station conventionally includes a computer 500 which controls the movement of a cylindrical head 510 by means of stepping motors $M_x$, $M_y$, and $M_z$. These motors move the cylindrical chuck 510 in the X, Y, and Z directions. In the X, Y direction, the motors conventionally move in 0.125 mil steps and in the Z direction 0.04 mil steps. The PACER station holds the probe card 10 firmly in a fixed position so that the cylindrical chuck 510 can be moved by the motors $M_x$, $M_y$, and $M_z$ to various positions under each of the probes 60. The computer 500 controls each motor over lines 502, 504, and 506 as shown in FIG. 5.

The PACER station conventionally determines probe planarity. That is, the PACER station automatically measures which plane the probe tip 70a of each probe 60a is oriented in. The computer 500 then statistically determines the mean value which is plane 130 in FIG. 4 and a statistical deviation or window 150 of acceptability. This information is stored in a memory 550 and the computer 500 is capable of storing this data and using this data over bus 552. The conventional PACER system is capable of displaying in a monitor 580 which probes 60a have their tips 70a outside of a desired window 150 of an expected plane location 130. Such probes will have to be adjusted to properly place their probe tips within the desired range 150 of the desired plane location 130.

A probe tip X, Y sensor 520 of the present invention is mounted on the cylindrical chuck 510 and is interconnected over lines 530 to a set of electronics 540 that determines the X, Y location of the probe tip 70a. This information is then delivered over lines 542 to the computer 500 which in turn stores this information in memory 560 over bus 562. The computer 500, under the teachings of the present invention, displays a first display 582 in monitor 580 and then a second display 584.

2. GENERAL OPERATION OF THE SYSTEM

Figure 6:
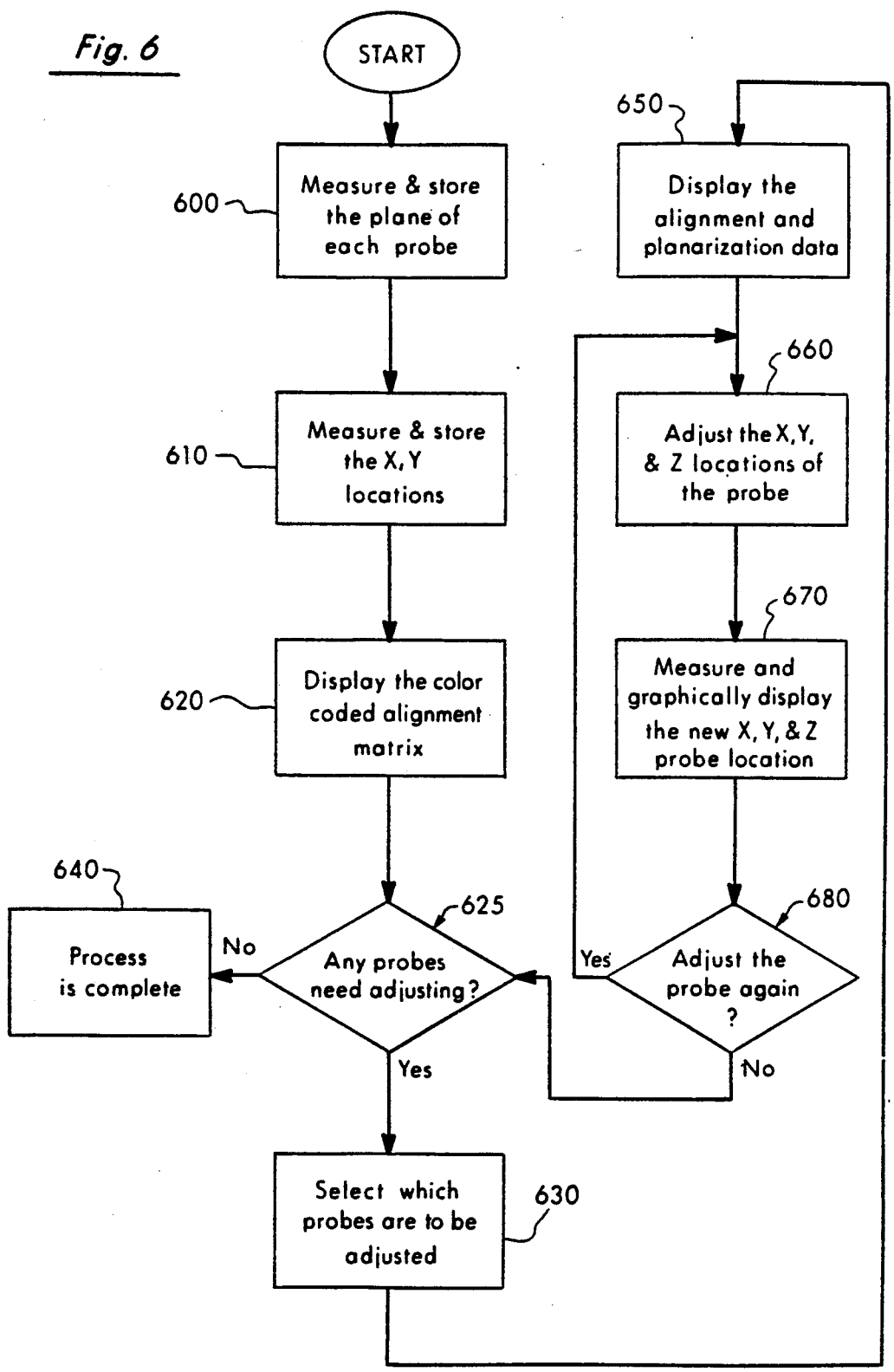
FIG. 6 is a flow chart setting forth the operation of the present invention.

In FIG. 6, the operation of the preferred embodiment of FIG. 5 is presented. At the START of the operation, the probe card 10 is held in a fixed orientation and the computer conventionally measures the plane of each probe and stores this information in memory 550. The statistical mean for plane 130 is calculated as well as the window 150. This occurs in stage 600 and is conventionally done. The assigned X, Y probe tip location 140 for each probe of a probe card is known and is previously stored in memory 560. For the probe card being tested, the assigned X, Y locations for each probe tip is known.

The computer then, under the teachings of the present invention, measures the X, Y coordinates of each probe tip 70 by stepping the sensor 520 of the present invention to within ±0.005 inches of the assigned X, Y positions according to the data in memory 560 through selective activation of motors $M_x$ and $M_y$. This is a sequential process with the sensor 520 being moved from tip 70a to tip 70b. It is to be expressly understood that the order or sequence of movement from probe tip to probe tip can be any desired pattern. At the assigned X, Y position for each tip 70, the sensor is moved in the Z direction to the measured plane and then moved upwardly a predetermined amount more to deflect the tip as is conventionally done when the probe card is used to test silicon chips. When in position, the sensor 540 delivers a measured X, Y position for the probe tip 70 over lines 530 into the X, Y location electronics 540 and back into the computer over lines 542. The above occurs in stage 610. The measured X, Y location data is stored in memory 590. The system can typically measure an individual probe tip in about 250 milliseconds or for a probe card having 100 tips, the present invention can measure the actual X, Y locations in 2.5 seconds.

The computer then displays a color coded alignment matrix as shown by display 582 over lines 581. As shown in FIG. 5, the display 582 shows each probe 60 graphically as a square icon 583. All probes 60 which fall within the predetermined windows 140 or 150 are acceptable and do not need to be further adjusted (acceptable probes have an icon 583 colored GREEN in the preferred embodiment). Probes 60 which are not acceptable, such as 60a, that exceed the predetermined windows 140 or 150 are colored RED and need to be adjusted. The above occurs in stage 620. It is to be expressly understood that a number of different color schemes, cross-hatching, or other types of icons could be utilized under the teachings of the present invention.

An operator views the monitor 580 at stage 625 and if any probe tip 70 are located outside of the predetermined window of acceptability 160, the operator causes the computer to enter stage 630. If all probe tips are properly aligned, the operator causes the computer to enter stage 640 which is a successful completion for testing the alignment of the probe tips for that particular probe card. At that point, a new probe card is inserted and START is reentered and the process repeats. However, if a probe tip needs adjusting, stage 630 is entered and the operator causes an input control 570 such as a conventional mouse or joystick to move a visual indicator 585 on the monitor to select a probe icon colored RED, such as 60a in FIG. 5.

The computer, under the teachings of the present invention, then enters stage 650 and graphically displays screen 584 for the selected icon (e.g., 60a). Screen 584 contains two types of visual information. The first type shows the measured plane information 586 which was statistically and conventionally generated. In the example of FIG. 4 wherein probe 60a has its tip 70a located in plane 130' which is outside of the accepted plane window 150, the area 587 is darkened on the visual display graph 586 indicating to the operator that the probe tip is outside the acceptable window. The acceptable plane window 150 in display 586 is shown as "1 through −1" which corresponds to window 150 of FIG. 2. Window 150 is set by the operator of the system to a desired value. If the probe tip exists in a plane outside this window, then it is visually indicated in a color such as RED as shown by 587 in FIG. 5. If it is within the acceptable window of "1 through −1", it is shown in a color such as GREEN. The operator in viewing this information knows that the tip 70a is below plane 130.

The second type of information 588 shown in display 584 pertains to the X, Y location as measured by sensor 520 of the present invention. The desired X, Y window of acceptability 160 is graphically indicated. The measured point 140a' is also shown with respect to the window 160. In essence, the second visual display 588 corresponds to an emulated pad on the silicon wafer, the window 160 is visually presented in display 584 so that the operator can quickly glance at the monitor 580 and see where the probe tip 70a actually resides. This is important information since in the example, the probe tip 60a is below the desired window 150 with respect to plane 130 and is outside of the desired X, Y window 160 which is illustrated in FIG. 4. The computer 500 in stage 650 uses the data corresponding to the plane information stored at 550 to create visual plane indicator 586 and uses the measured X, Y information from electronics 540 to create an X, Y graph 588.

At a glance, the operator can easily ascertain the direction to move the tip 70a and an approximation as to how far to move the tip from displays 586 and 588. Hence, the operator will look through the conventional microscope 330 and move the probe 60a in the direction of arrow 400 (as shown in FIG. 4). This is shown as stage 660 in FIG. 6.

The computer 500 will then remeasure both the plane, in a conventional sense, and the X, Y location, under the teachings of the present invention, in stage 670. A new display 588 will be created and if the probe tip 70 is properly aligned within X, Y window 160 and within plane window 150, then adjustment of the selected probe is complete and in stage 680, the system returns to stage 625 for the next selected probe for adjustment and the above process is then repeated. If no more probes need to be adjusted, then that probe card is done 640. If the selected probe tip is still improperly positioned, the operator readjusts the probe tip in stage 660 and activates the computer in stage 670. This process is repeated until the tip is properly aligned.

3. DETAILS OF SENSOR

Figure 9:
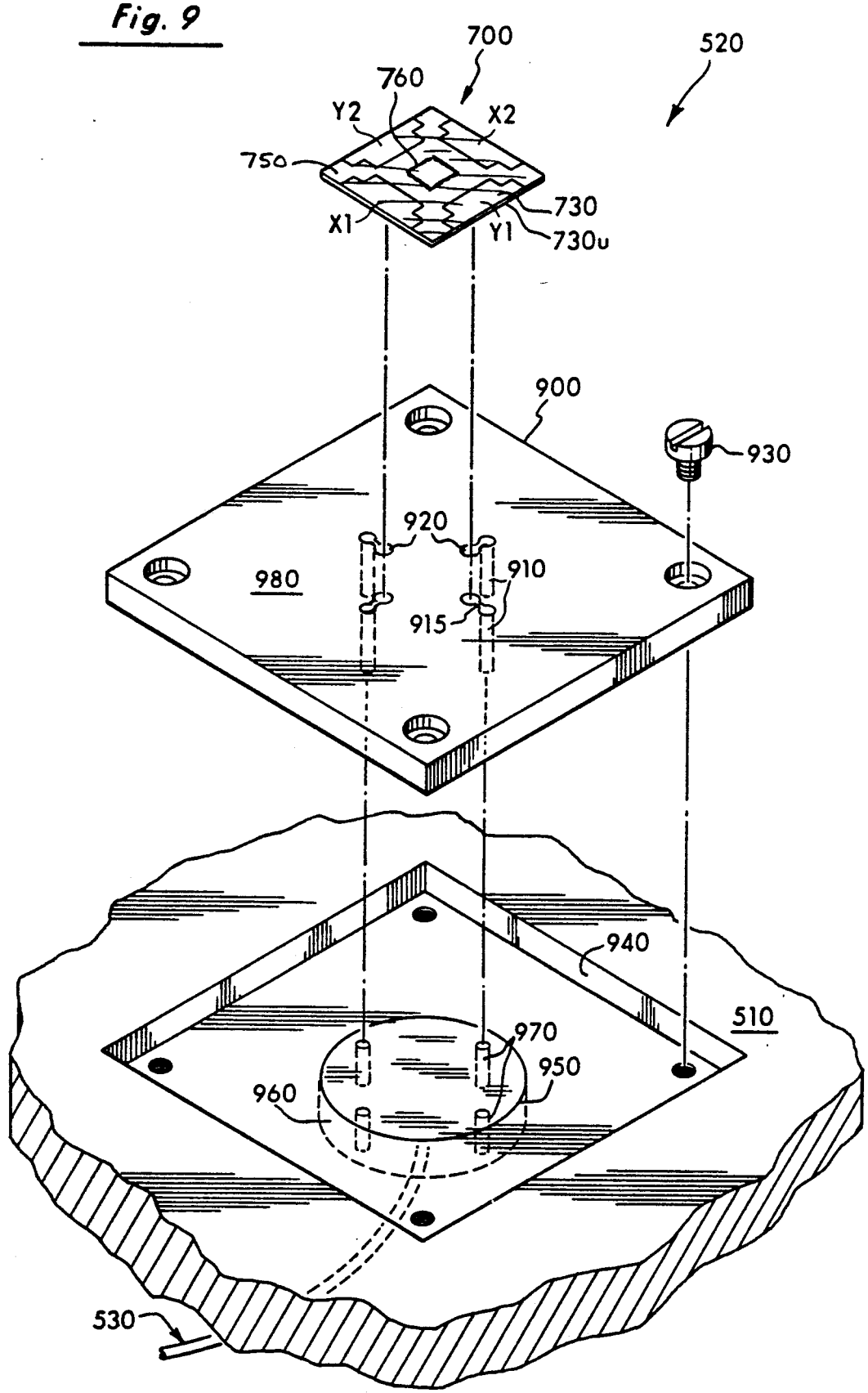
FIG. 9 is an exploded perspective view showing the installation of the sensor of the present invention into the moving cylindrical chuck.

The details of the sensor 520 are shown in FIGS. 7, 8, and 9. A sensor chip 700 has a glass substrate 710 upon which is deposited, in the cross-pattern shown in FIG. 7, resistive film, 720, 0.020 inches thick. The resistive film is durable enough to withstand the tip 70 sliding thereon as the sensor is moved in the Z direction to deflect the tip as earlier discussed. While the preferred embodiment uses a cross-pattern for the deposit of the resistive film, it is to be expressly understood that a number of suitable patterns could be used to provide a suitable X1-X2 and Y1-Y2 resistive paths such as, for example, a square or rectangular pattern, a circle, etc. Conductive pads X1, X2, Y1, and Y2 are deposited over the glass 710 and over the resistive film 720. Each conductive pad 730 overlaps an area 740 of the resistive film 720 in order to provide an X direction conductive path through the resistive film and a Y direction conductive path through the resistive film. The sensor chip 700 is 0.05 inches square. In the preferred embodiment, the resistive film is made from ruthenium oxide and the conductive paths 730 are made from palladium silver. As shown in FIG. 8, the conductive pads 730 wrap around the sides of the sensor and onto the bottom surface of the glass 710. The size of the measurement area 760 is such that only one probe tip engages the area at a time. Finally, a passive material 750 is deposited over the conductive pads 730, the resistive film 720, and the remaining portions of the glass 710 except in the area of sensing or measurement 760. In the preferred embodiment, the area 760 is 5 mils square and the invention is not to be limited by this dimension. The passive material is made from a suitable electrically insulating composition such as glass.

It is to be expressly understood that the substrate could be made of any suitable insulating and supportive material other than glass such as, for example, ceramic. Furthermore, any shape could be utilized for the substrate such as circular, etc.

Finally, more than one measurement window 760 or more than one sensor 700 could be utilized. For example, two separate windows could be formed on the sensor chip 700.

The sensor chip 700 is mounted to a circuit board 900 as shown in FIG. 9. On the circuit board 900 are downwardly extending pins 910 which have conductive traces 915 to solder pads 920. The conductive coating 730u on the underside of glass 710 is soldered to solder pads 920. This firmly affixes the sensor chip 700 to the circuit board 900. In the preferred embodiment, the circuit board 900 is 1" square, and 0.062 inches thick, but it is to be expressly understood that a different shaped board (such as circular) or different sizes would work equally as well.

The circuit board 900 is mounted by means of screws 930 into the cylindrical chuck 510. The cylindrical chuck 510 has a formed recess 940 which receives the circuit board 900. Disposed within the formed recess 940 is an electrical plug 950 which is disposed in a second formed recess 960. In other words, the chuck 510 has a first formed recess 940 which is square in perimeter and which receives the circuit board 900. A second formed recess 960 cylindrically shaped is disposed in the center of formed recess 940 and receives a cylindrical electrical plug 950. The electrical plug 950 has four electrical connectors 970 which receive the pins 910 of the circuit board 900. The electrical connectors 970 are electrically connected to wires 530 for delivery to the X, Y location electronics 540.

Hence, sensor chip 700 is soldered onto the circuit board 900 so that pins 910 are electrically connected to the conductive pad 730. The circuit board 910 engages the electrical connector 950 in the chuck 510. The sensor 520 is mounted in the chuck 510 so as to position the measurement area 760 about 5 mils above the planarization area 1130 of the chuck. This prevents other probe tips from contacting the chuck.

As shown in FIGS. 7 and 9, the defined X, Y the measurement area 760 is 5 mils square. In area 760 the window 160 can be optionally scribed onto the resistive film 720 so that the operator can have a visual reference when the operator looks through the microscope 330 as in FIG. 3. This differs from the prior art approach wherein the operator imagines the existence of the window 160. However, the scribing of window 160 is not required under the teachings of the present invention.

It is to be fully understood that while the preferred embodiment uses a resistive thin film approach, that other types of sensors could also be used. For example, a thin film capacitive sensor could be suitably substituted for the voltage divider resistive approach. Likewise, an optical sensor using a beam of light directed at the probe tip and focused through a lens onto a CCD light sensing array would also precisely locate the tip. Under the teachings of the present invention, the sensor whether of the preferred construction or another suitable construction as discussed above is moved by the system to engage each individual tip as fully discussed above to measure its actual location for comparison to its assigned X, Y location.

4. X, Y LOCATION AND ELECTRONICS

In FIG. 10, the X, Y location electronics 540 is shown. The X, Y location electronics 540 includes a switching matrix 1000, a volt meter 1010, an address decoder 1020, and a volt regulator 1030.

The computer 500 directly accesses the switching matrix 1000 over lines 532a. The switching matrix 1000 selects the probe 60a that is to have its X, Y location measured. The switching matrix 1000 is capable of directly connecting any one of the probes on card 10 to voltmeter 1010 over lines 1002. The voltmeter 1010 measures the voltage as sensed by the selected probe 60a and delivers a digital value for the voltage over line 532b directly into the computer 500. The computer 500 also directly accesses the address decoder 1020 over lines 542. The address decoder essentially activates transistors $T_x$ or transistors $T_y$. When transistors $T_x$ are activated, the voltage from regulator 1030 is delivered through lines 1032, through resistor 1034, through transistor $T_{x2}$, through the sensor chip 700 (between conductive paths X1 and X2) and through transistor $T_{x1}$ to ground. Likewise, when the address decoder activates transistors $T_y$, voltage is delivered over lines 1036 through resistor 1038 and through transistor $T_{y2}$ through the sensor 700 (between conductive paths Y1 and Y2) and through transistor $T_{y1}$ to ground. The resistors are preferably 10 ohms each. While the circuit of FIG. 10 is a preferred embodiment, it is to be expressly understood that any suitable circuit configuration could be utilized to deliver a voltage across the chip 700 and to select a particular probe tip for measurement.

The voltage regulator or voltage source 1030 in the preferred embodiment, delivers +3 volts so that the voltage drop across the measurement area 760 in either the X or Y direction is 0.15 volts (0.03 volts per mil). Hence, the X, Y location electronics 540 produces a precise voltage drop for X1, X2 and for Y1, Y2 directions so that the probe tip 70a picks up a discrete X voltage and a discrete Y voltage from sensor 700. The unique X, Y voltage values are then delivered into the computer 500 for delivery into storage 590 as a measured X, Y location. In the preferred embodiment, the voltage regulator 1030 delivers three volts on leads 1032 and 1036 to ground. The present invention is not limited to 3 volts as any suitable voltage value could be utilized. The transistors $T_x$ and $T_y$ are commonly available as IFRDO20 and IFRD920.

While the present invention contemplates providing voltage to the resistive film as shown, it is to be expressly understood that the direction and positioning can be suitably varied without departing from the scope of the present invention. Furthermore, an embodiment could be designed wherein the voltage source is provided through the probe tip and the measuring signals being received from the conductive pads.

5. DETAILS OF CHUCK HEAD

Figure 11:
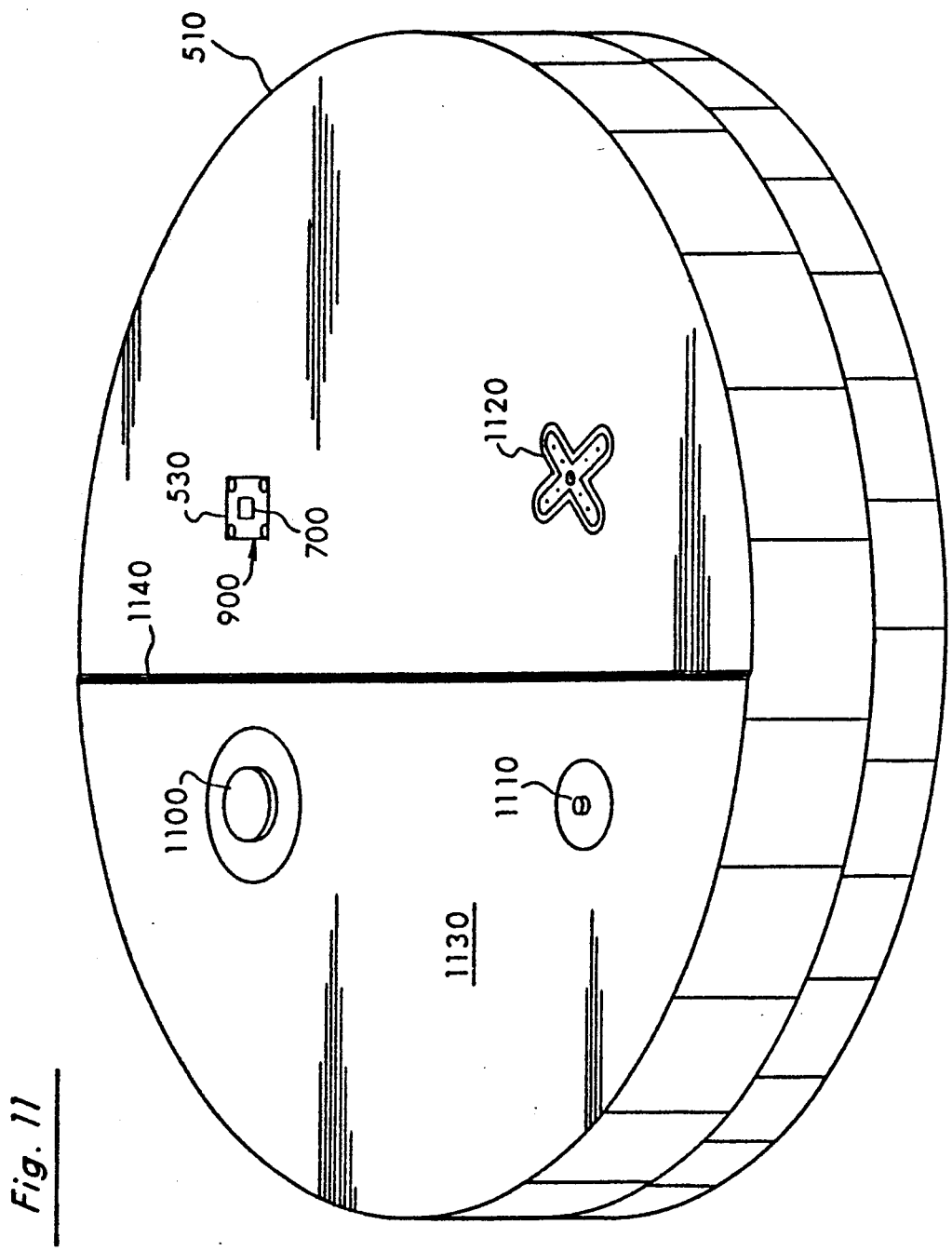
FIG. 11 is a perspective view of a conventional chuck carrying the sensor of the present invention.

Shown in FIG. 11 are the details of a conventional chuck head 510. In FIG. 11, the circuit board 900 of the present invention is shown mounted to the chuck 510. The circuit board 900 carries the sensor chip 700 which is connected to leads 530.

Also on the chuck 510 is a conventional load cell 1100, a conventional Common Pin Planarization (CPP) 1110 and a conventional vacuum 1120 pulled recess for holding a silicon wafer. Finally, a conventional area 1130 is provided for the planarization test. A step 1140 of 25 mils is provided across chuck 510 so that the sensor chip 700 or the silicon wafer is not significantly above the plane that the planarization area resides in. Hence, as shown in FIG. 11, the present invention retrofits to an existing chuck 510. Typically, the diameter of chuck 510 is 4 inches, having a flatness over the upper surface of 0.5 mils.

It is to be expressly understood that the claimed invention is not to be limited to the description of the preferred embodiment but encompasses other modifications and alterations within the scope and spirit of the inventive concept.

I claim:

1. A system for determining probe tip alignment for a probe card (10) having a plurality of probes (60) downwardly extending in a defined region (50) of said probe card, each probe having its tip (70) assigned to an X, Y position (140) in a plane (130) spaced from said probe card, each probe having the location of its tip (70) measured with respect to said plane, said system comprising:

first means (560) for storing said assigned X, Y position for each of said plurality of tips, second means (590) for storing said measured location of the plane that each of said plurality of tips is found in, means (520, 530) for measuring the X, Y position of at least one probe tip, said measuring means including:

an insulating substrate (710), a resistive film (720) deposited on said insulating substrate in a predetermined pattern, conductive pads (730) deposited to contact said resistive film for providing an X direction conductive path (X1-X2) through said resistive film and for providing a Y direction conductive path (Y1-Y2) through said resistive film, and a second insulating layer deposited over said insulating substrate, said resistive film, and said conductive paths, said second layer having a formed opening over said resistive film defining a measurement area (760) for the selective engagement by one probe tip;

means ($M_x$, $M_y$, $M_z$) for moving said measuring means, and means (500) connected to said moving means and to said first and second storing means for activating said moving means to move said measuring means until said at least one of said plurality of probe tips at said measured plane locations from said second storing means and at the assigned X, Y positions from said first storing means engages said measuring means, said measuring means determining the measured X, Y positions of said at least one of said plurality of probe tips when engaged.

2. The system of claim 1 wherein said measuring means further comprises:

a voltage source (1030) for generating a predetermined voltage, and means ($T_{x1}$, $T_{x2}$, $T_{y1}$, $T_{y2}$) connected to said voltage source and to said conductive pads for selectively applying said predetermined voltage to said X direction conductive path and to said Y direction conductive path.

3. The system of claim 2 wherein said measuring means further comprises:

means (1000) for selectively contacting said one probe tip when each said one probe tip engages said resistive film in said measurement area, and means (1010) connected to said contacting means for sensing the voltage from said one engaged probe tip.

4. A system for determining probe tip alignment for a probe card (10) having a plurality of probes (60) downwardly extending in a defined region (50) of said probe card, each probe having its tip (70) assigned to an X, Y position (140) in a plane (130) spaced from said probe card, said system comprising:

first means (560) for storing said assigned X, Y position for each of said plurality of tips, second means (590) for storing the measured location of the plane that each of said plurality of tips is found in, a sensor (520, 530) for measuring the X, Y position of at least one probe tip, said sensor comprising:

an insulating substrate (710), a resistive film (720) deposited on said insulating substrate in a predetermined pattern, conductive pads (730) deposited to contact said resistive film for providing an X direction conductive path (X1-X2) through said resistive film and for providing a Y direction conductive path (Y1-Y2) through said resistive film, and a second insulating layer deposited over said insulating substrate, said resistive film, and said conductive paths, said second layer having a formed opening over said resistive film defining a measurement area (760) for the selective engagement by one probe tip;

means ($M_x$, $M_y$, $M_z$) for moving said sensor, a computer (500) connected to said moving means and to said first and second storing means for activating said moving means to move said sensor under said at least one of said plurality of probe tips at said measured plane locations from said second storing means and at the assigned X, Y positions from said first storing means, said computer being connected to said sensor for receiving the measured X, Y positions of said at least one of said plurality of probe tips, a monitor, and said computer being connected to said monitor (580) for producing a first display (582) showing which of said plurality of probe tips had a measured X, Y position exceeding said assigned X, Y position by a predetermined window (160) thereby indicating all probe tips which need adjustment, said computer producing a second display (584) indicating both said measured plane location from said second storing means and said measured X, Y position of a selected one of said probe tips which need adjustment.

5. The system of claim 4 wherein said sensor further comprises:

a voltage source (1030) for generating a predetermined voltage, and means ($T_{x1}$, $T_{x2}$, $T_{y1}$, $T_{y2}$) connected to said voltage source and to said conductive pads for selectively applying said predetermined voltage to said X direction conductive path and to said Y direction conductive path.

6. The system of claim 5 wherein said sensor further comprises:

means (1000) for selectively contacting said one probe tip when each said one probe tip engages said resistive film in said measurement area, and means (1010) connected to said contacting means for sensing the voltage from said one engaged probe tip.

7. A system for determining probe tip alignment for a probe card (10) having a plurality of probes (60) downwardly extending in a defined region (50) of said probe card, each probe having its tip from said probe card, said system comprising:

first means (560) for storing said assigned X, Y position for each of said plurality of tips, second means (590) for storing the measured location of the plane that each of said plurality of tips is found in, a sensor (520, 530) for measuring the X, Y position of said probe tips, said sensor comprises:
  an insulating substrate (710),
  a resistive film (720) deposited on said insulating substrate in a predetermined pattern,
  conductive pads (730) deposited to contact said resistive film for providing an X direction conductive path (X1-X2) through said resistive film and for providing a Y direction conductive path (Y1-Y2) through said resistive film, and
  a second insulating layer deposited over said insulating substrate, said resistive film, and said conductive paths, said second layer having a formed opening over said resistive film defining a measurement area (760) for the selective engagement by one probe tip;

means ($M_x$, $M_y$, $M_z$) for moving said sensor, a computer (500) connected to said moving means and to said first and second storing means for activating said moving means to move said sensor under said probe tips at said measured plane locations from said second storing means and at the assigned X, Y positions from said first storing means, said computer being connected to said sensor for receiving the measured X, Y positions of said probe tips, a monitor, and said computer being connected to said monitor (580) for producing a display (582) showing which of said plurality of probe tips had a measured X, Y position exceeding said assigned X, Y position by a predetermined window (160) thereby indicating all probe tips which need adjustment.

8. A system for determining probe tip alignment for a probe card (10) having a plurality of probes (60) downwardly extending in a defined region (50) of said probe card, each probe having its tip (70) assigned to an X, Y position (140) in a plane (130) spaced from said probe card, each probe having the location of its tip (70) measured with respect to said plane, said system comprising:

means (520, 530) for measuring the X, Y position of each said probe tip, said measuring means comprising:
  (a) an insulating substrate (710),
  (b) a resistive film (720) deposited on said insulating substrate in a predetermined pattern,
  (c) conductive pads (730) deposited to contact said resistive film for providing an X direction conductive path (X1-X2) through said resistive film and for providing a Y direction conductive path (Y1-Y2) through said resistive film,
  (d) a second insulating layer deposited over said insulating substrate, said resistive film, and said conductive paths, said second layer having a formed opening over said resistive film defining a measurement area (760) for the selective engagement by each said probe tip,
  (e) a voltage source (1030) for generating a predetermined voltage,
  (f) means ($T_{x1}$, $T_{x2}$, $T_{y1}$, $T_{y2}$) connected to said voltage source and to said conductive pads for selectively applying said predetermined voltage to said X direction conductive path and to said Y direction conductive path,
  (g) means (1000) for selectively contacting each said probe tip when each said probe tip engages said resistive film in said measurement area,
  (h) means (1010) connected to said contacting means for sensing the voltage from each said probe tip, means ($M_x$, $M_y$, $M_z$) for moving said measuring means, and means (500) connected to said moving means and to said first and second storing means for activating said moving means to move said measuring means into said engagement with each said probe tip at said measured plane locations from said second storing means and at the assigned X, Y positions from said first storing means, said measuring means determining the measured X, Y positions of each said probe tip when engaged.

9. A method for determining probe tip alignment for a probe card (10) having a plurality of probes (60) downwardly extending in a defined region (50) of said probe card, each of said plurality of probes having its tip (70) assigned to an X, Y position (140) in a plane (130) spaced from said probe card, said method comprising the steps of:

holding the probe card in a fixed position, determining the location of the plane in which each probe tip exists;

moving a sensor to a predetermined location under each probe tip to engage the probe tip, said predetermined location being the assigned X, Y position and the measured location of the plane, measuring the actual location of each probe tip as the probe tip engages the sensor at the predetermined location, displaying the identity of all probes whose tips have a measured location exceeding, by a predetermined window, the assigned X, Y position for the tip, thereby indicating which tips require adjustment, selecting one tip requiring adjustment in response to said step of displaying, and displaying the measured position of the selected probe tip in relation to the predetermined window of the assigned X, Y position for the selected tip thereby indicating in which X, Y direction the selected tip is to be adjusted.

10. The method of claim 9 further comprising the step of displaying the determined location of the plane in which the selected probe tip exists in relation to the predetermined window for the assigned plane, thereby indicating the identity of all probes whose tips have a measured location within a predetermined window of the assigned X, Y position, for the direction in which the selected tip is to be adjusted.

11. A method for determining probe tip alignment for a probe card (10) having a plurality of probes (60) downwardly extending in a defined region (50) of said probe card, each of said plurality of probes having its tip (70) assigned to an X, Y position (140) in a plane (130) spaced from said probe card, said method comprising the steps of:

holding the probe card in a fixed position, moving a sensor to a predetermined location under each probe tip to engage the probe tip, said predetermined location being the assigned X, Y position, measuring the actual location of each probe tip as the probe tip engages the sensor at the predetermined location, displaying the identity of all probes whose tips have a measured location exceeding, by a predetermined window, the assigned X, Y position for the tip, thereby indicating which tips require adjustment, selecting one tip requiring adjustment in response to said step of displaying, and displaying the measured position of the selected probe tip in relation to the predetermined window of the assigned X, Y position for the selected tip thereby indicating in which X, Y direction the selected tip is to be adjusted.

12. The method of claim 11 further comprising the step of displaying the determined location of the plane in which the selected probe tip exists in relation to the predetermined window for the assigned plane, thereby indicating the identity of all probes whose tips have a measured location within a predetermined window of the assigned X, Y position, for the direction in which the selected tip is to be adjusted.

13. A system for determining probe tip alignment for a probe card (10) having a plurality of probes (60) downwardly extending in a defined region (50) of said probe card, each probe having its tip (70) assigned to an X, Y position (140) in a plane (130) spaced from said probe card, each probe having the location of its tip (70) measured with respect to said plane, said system comprising:

first means (560) for storing said assigned X, Y position for each of said plurality of tips, second means (590) for storing said measured location of the plane that each of said plurality of tips is found in, means (520, 530) for selectively measuring the X, Y position of a discrete probe tip, said measuring means comprises:
(a) an insulating substrate (710),
(b) a resistive film (720) deposited on said insulating substrate in a predetermined pattern,
(c) conductive pads (730) deposited to contact said resistive film for providing an X direction conductive path (X1-X2) through said resistive film and for providing a Y direction conductive path Y1-Y2) through said resistive film, and
(d) a second insulating layer deposited over said insulating substrate, said resistive film, and said conductive paths, said second layer having a formed opening over said resistive film defining a measurement area (76) for the selective engagement by one probe tip, means ($M_x$, $M_y$, $M_z$) for moving said measuring means, means (500) connected to said moving means and to said first and second storing means for activating said moving means to move said measuring means until said discrete probe tip at said measured plane locations from said second storing means and at the assigned X, Y positions from said first sorting means engages said measuring means, said measuring means determining the measured X, Y positions of said discrete probe tip when engaged.

14. The system of claim 13 wherein said measuring means further comprises:

a voltage source (1030) for generating a predetermined voltage, and means ($T_{x1}$, $T_{x2}$, $T_{y1}$, $T_{y2}$) connected to said voltage source and to said conductive pads for selectively applying said predetermined voltage to said X direction conductive path and to said Y direction conductive path.

15. The system of claim 14 wherein said measuring means further comprises:

means (1000) for selectively contacting said discrete probe tip when said discrete probe tip engages said resistive film in said measurement area, and means (1010) connected to said contacting means for sensing the voltage from said engaged discrete probe tip.

16. A system for determining probe tip alignment for a probe card (10) having a plurality of probes (60) downwardly extending in a defined region (50) of said probe card, each probe having its tip (70) assigned to an X, Y position (140) in a plane (130) spaced from said probe card, said system comprising:

first means (560) for storing said assigned X, Y position for each of said plurality of tips, second means (590) for storing the measured location of the plane that each of said plurality of tips is found in, a second (520, 530) for selectively measuring the X, Y position of a discrete probe tip, wherein said sensor comprises
(a) an insulating substrate (710),
(b) a resistive film (720) deposited on said insulating substrate in a predetermined pattern,
(c) conductive pads (730) deposited to contact said resistive film for providing an X direction conductive path (X1-X2) through said resistive film and for providing a Y direction conductive path (Y1-Y2) through said resistive film, and
(d) a second insulating layer deposited over said insulating substrate, said resistive film, and said conductive paths, said second layer having a formed opening over said resistive film defining a measurement area (760) for the selective engagement by one probe tip, means ($M_x$, $M_y$, $M_z$) for moving said sensor, a computer (500) connected to said moving means and to said first and second storing means for activating said moving means to move said sensor under said discrete probe tip at said measured plane locations from said second storing means and at the assigned X, Y positions from said first storing means, said computer being connected to said sensor for receiving the measured X, Y position of said discrete probe tip, a monitor, and said computer being connected to said monitor (580) for producing a first display (582) showing which of said plurality of probe tips had a measured X, Y position exceeding said assigned X, Y position by a predetermined window (160) thereby indicating all probe tips which need adjustment, said computer producing a second display (584) indicating both said measured plane location from said second storing means and said measured X, Y position of a selected one of said probe tips which need adjustment.

17. The system of claim 16 wherein said sensor further comprises:
a voltage source (1030) for generating a predetermined voltage, and
means ($T_{x1}$, $T_{x2}$, $T_{y1}$, $T_{y2}$) connected to said voltage source and to said conductive pads for selectively applying said predetermined voltage to said X direction conductive path and to said Y direction conductive path.

18. The system of claim 17 wherein said sensor further comprises:
means (1000) for selectively contacting said discrete probe tip when said discrete probe tip engages said resistive film in said measurement area, and
means (1010) connected to said contacting means for sensing the voltage from said engaged discrete probe tip.

* * * * *